US005631807A

United States Patent [19]
Griffin

[11] Patent Number: 5,631,807
[45] Date of Patent: May 20, 1997

[54] ELECTRONIC CIRCUIT STRUCTURE WITH APERTURE SUSPENDED COMPONENT

[75] Inventor: Michael E. Griffin, Maplewood, Minn.

[73] Assignee: Minnesota Mining and Manufacturing Company, St. Paul, Minn.

[21] Appl. No.: 376,017

[22] Filed: Jan. 20, 1995

[51] Int. Cl.⁶ .................... H05K 1/11; H05K 1/18; H05K 7/20; H05K 7/14
[52] U.S. Cl. .......... 361/794; 174/252; 174/255; 174/260; 174/262; 257/723; 257/724; 361/761; 361/764; 361/792; 361/818; 361/820; 361/717; 361/718; 361/719; 361/720; 361/788; 361/796; 361/799; 361/800; 361/803; 439/68; 439/83; 439/61
[58] Field of Search .................. 361/761, 763, 361/764, 772, 773, 776, 782, 783, 792–795, 820, 788, 796, 799, 800, 816, 818, 717–720; 174/252, 253, 255, 260, 261, 262, 265; 29/832; 228/179.1, 180.1, 180.21; 257/678, 684, 692, 723, 724, 728; 439/68, 83, 61; 437/209; 333/246, 247

[56] References Cited

U.S. PATENT DOCUMENTS

| | | |
|---|---|---|
| 3,702,953 | 11/1972 | Fauth et al. ............... 361/761 |
| 4,408,255 | 10/1983 | Adkins ..................... 361/382 |
| 4,611,887 | 9/1986 | Glover et al. ............. 350/96.21 |
| 4,630,172 | 12/1986 | Stenerson et al. ......... 361/386 |
| 4,677,528 | 6/1987 | Miniet ..................... 361/398 |
| 4,678,264 | 7/1987 | Bowen et al. ............. 350/96.2 |
| 4,679,872 | 7/1987 | Coe ......................... 439/61 |
| 4,701,781 | 10/1987 | Sankhagowit ............. 357/70 |
| 4,705,917 | 11/1987 | Gates, Jr. et al. .......... 174/52 FP |
| 4,732,446 | 3/1988 | Gipson et al. ............. 350/96.15 |
| 4,762,388 | 8/1988 | Tanaka et al. ............. 350/96.2 |
| 4,807,955 | 2/1989 | Ashman et al. ............ 350/96.2 |
| 4,840,451 | 6/1989 | Sampson et al. .......... 350/96.2 |
| 4,877,302 | 10/1989 | Schurmann et al. ....... 350/96.21 |
| 4,881,116 | 11/1989 | Hidada et al. . |
| 4,922,325 | 5/1990 | Smeltz, Jr. . |

(List continued on next page.)

FOREIGN PATENT DOCUMENTS

| | | |
|---|---|---|
| 1524373 | 2/1968 | France . |
| 40 22 829A1 | 1/1992 | Germany . |
| 59-114845 | 7/1984 | Japan ............ H01L 23/12 |
| 59-161843 | 9/1984 | Japan ............ H01L 23/12 |
| 61-214594 | 9/1986 | Japan ............ H01S 3/18 |
| 1-164052 | 6/1989 | Japan ............ H01L 23/12 |
| 2-134890 | 5/1990 | Japan ............ 361/68 |
| 63-179505 | 6/1990 | Japan ............ H05K 1/18 |
| 2-151095 | 6/1990 | Japan ............ 439/83 |
| 63-289375 | 8/1990 | Japan ............ H05K 1/18 |
| 2-308588 | 12/1990 | Japan ............ 439/83 |
| 3-29389 | 2/1991 | Japan ............ 439/83 |
| 4-206797 | 7/1992 | Japan ............ 361/820 |
| 5-93826 | 4/1993 | Japan ............ G02B 6/42 |
| 6-334298 | 2/1994 | Japan ............ 439/83 |

*Primary Examiner*—Donald A. Sparks
*Attorney, Agent, or Firm*—Gary L. Griswold; Walter N. Kirn; H. Sanders Gwin, Jr.

[57] ABSTRACT

An electronic circuit structure having a reduced size includes a circuit substrate, an aperture extending through the circuit substrate, and an electronic component suspended within the aperture. The suspension of the electronic component within the aperture significantly reduces the profile of the overall electronic circuit structure. The aperture further enables electronic components to be mounted in a partially overlapping fashion to reduce the surface area of the electronic circuit structure. The electronic circuit structure can make use of standard FR-4, G-10, or ceramic circuit substrates or multilayer flex circuits, as well as electronic components in the form of standard leaded integrated circuit packages. The mounting of the electronic component within the aperture of the circuit substrate provides an advantage of assisting in heat dissipation. The incorporation of mesh-like voltage and ground planes can further aid in heat dissipation and provide electrical isolation and capacitive filtering. In addition, the electronic circuit structure facilitates high density packaging of several electronic structures, for example, in a stacked or radial configuration.

27 Claims, 7 Drawing Sheets

U.S. PATENT DOCUMENTS

| | | | |
|---|---|---|---|
| 4,944,568 | 7/1990 | Danbach et al. | 350/96.2 |
| 4,959,750 | 9/1990 | Cnyrim et al. | 361/761 |
| 4,986,762 | 1/1991 | Keith | 439/131 |
| 4,998,182 | 3/1991 | Krauter et al. | 361/394 |
| 5,013,247 | 5/1991 | Watson | 439/55 |
| 5,016,085 | 5/1991 | Hubbard et al. | |
| 5,016,968 | 5/1991 | Hammond et al. | 350/96.2 |
| 5,104,243 | 4/1992 | Harding | 385/84 |
| 5,150,280 | 9/1992 | Arai et al. | 361/401 |
| 5,155,784 | 10/1992 | Knott | 385/88 |
| 5,166,995 | 11/1992 | Briggs | 385/58 |
| 5,204,925 | 4/1993 | Bonanni et al. | 385/89 |
| 5,206,986 | 5/1993 | Arai et al. | 29/840 |
| 5,208,732 | 5/1993 | Baudouin et al. | 361/720 |
| 5,230,030 | 7/1983 | Hartman et al. | 395/50 |
| 5,239,606 | 8/1993 | Shibutani et al. | 385/89 |
| 5,241,614 | 8/1993 | Ecker et al. | 385/94 |
| 5,325,455 | 6/1994 | Henson et al. | 385/89 |
| 5,386,343 | 1/1995 | Pao | 361/761 |
| 5,412,538 | 5/1995 | Kikinis et al. | 361/761 |

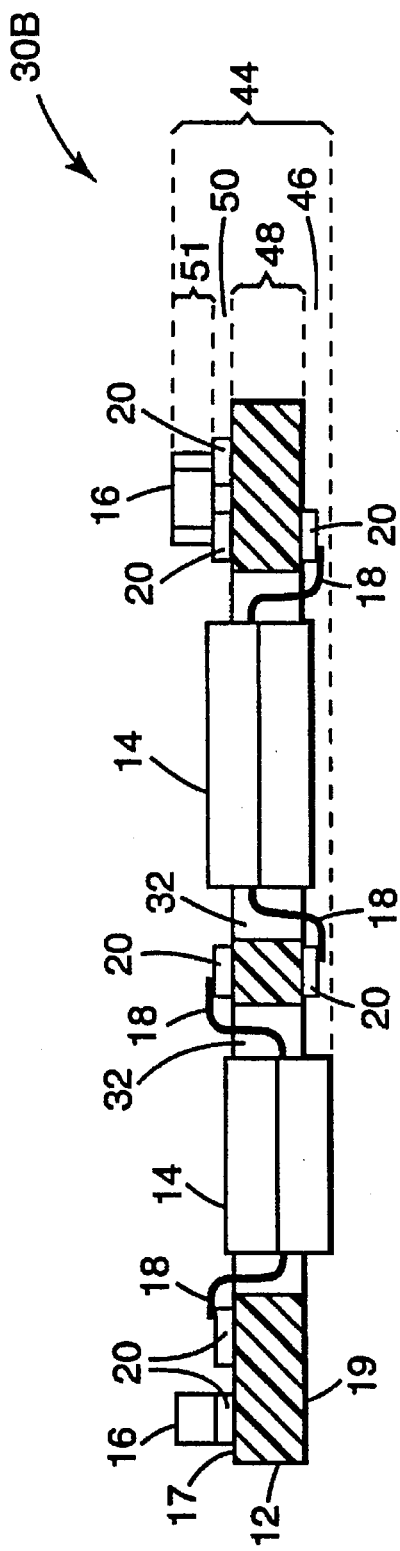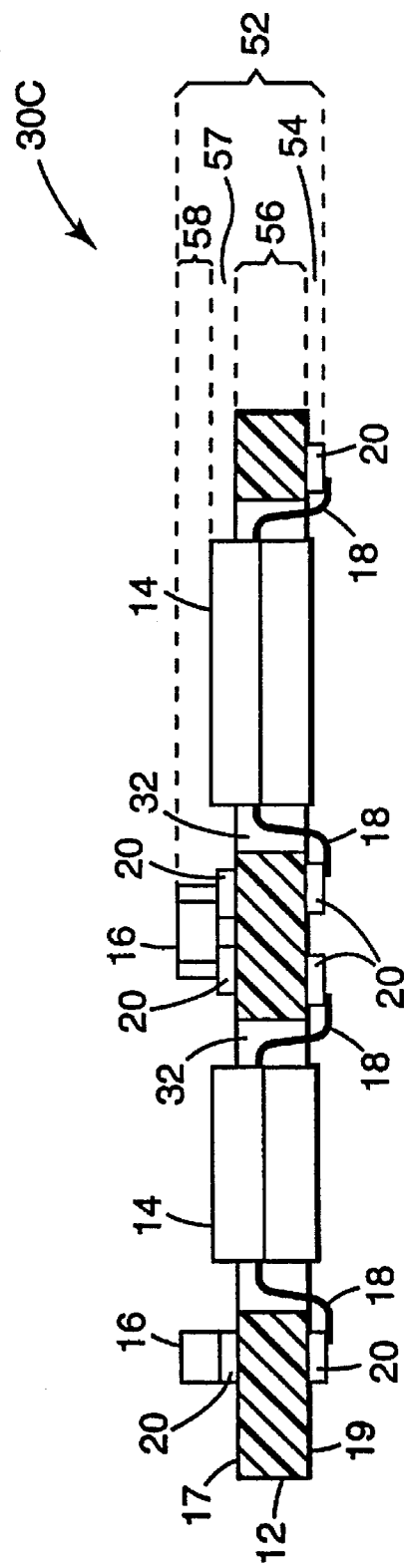

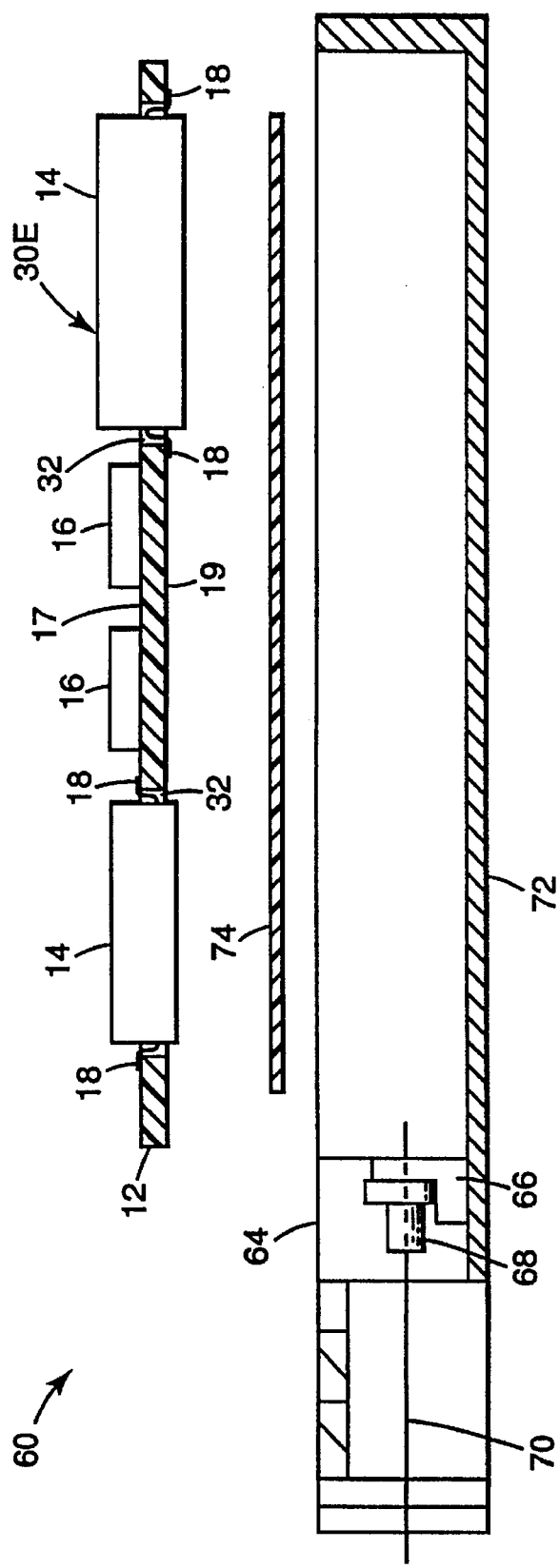
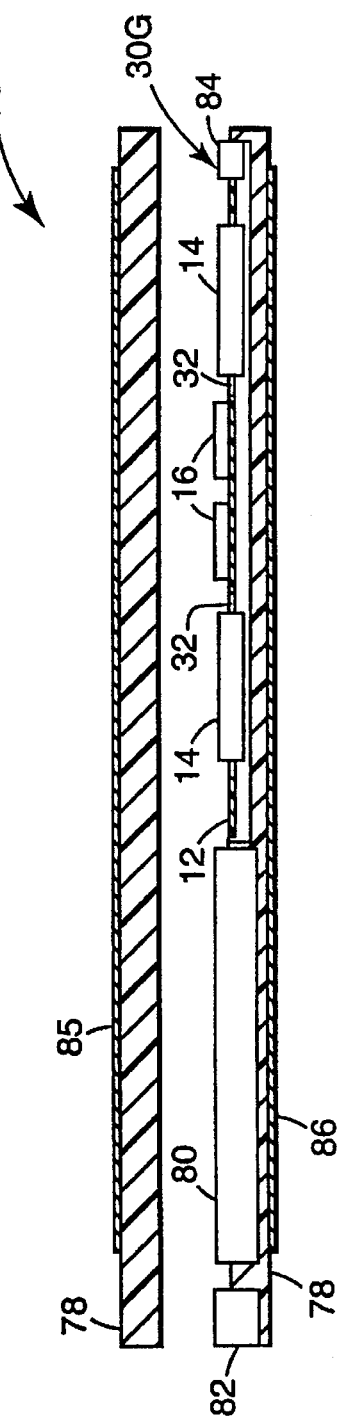
FIG. 4
FIG. 6

ELECTRONIC CIRCUIT STRUCTURE WITH APERTURE SUSPENDED COMPONENT

FIELD OF THE INVENTION

The present invention relates generally to electronic circuit structures and, more particularly, to electronic circuit structures having reduced size.

DISCUSSION OF RELATED ART

Advancements in the communication capacity of high-performance, distributed computing and instrumentation systems, as well as personal computing systems, have led to a tremendous increase in the number of necessary point-to-point, bus, and network communication links. At the same time, hardware miniaturization and increased packaging density in such computing and instrumentation systems have placed constraints on the size of the necessary communication links.

Form factors established by the Personal Computer Memory Card International Association (PCMCIA), for example, have resulted in a drastic reduction in the size of various communication link cards used in personal computing systems. In larger computing and instrumentation systems, there has been a proliferation of high performance hardware such as high speed communication bridges, routers, and non-blocking data switches, resulting in the concentration of the number of required communication links into a much smaller volume.

The trends toward miniaturization and increased packaging density in both personal computers and larger computing and instrumentation systems have produced a demand for communication links having minimal size, but equivalent performance and cost effectiveness. This demand is particularly challenging due to the size of existing hardware and problems of impedance control, electrical isolation, thermal transfer, and capacitive filtering that become more troublesome as size is reduced. Unfortunately, the use of conventional circuit structure technology has made electrical communication links and especially optical communication links too bulky for many low to moderate volume applications.

Communication links using conventional circuit structure technology generally include an electronic circuit structure having electronic components that are surface or through-hole mounted to a circuit substrate. The surface or through-hole mounting techniques produce a linear accumulation of thickness, resulting in a profile that may be unsuitable for many space-constrained applications. The use of surface or through-hole mounting techniques commonly produces a circuit structure profile on the order of 0.4 inches in height, for example, which is too large for many volume requirements.

Necessary lateral clearance between adjacent electronic components mounted by surface or through-hole mounting techniques can produce an undesirably large surface area, similarly rendering the communication link unsuitable for placement in smaller volumes. The use of conventional surface or through-hole mounting techniques commonly requires undesirable component-to-component spacings on the circuit substrate, for example, which tend to produce a surface area that is too large for many volume requirements.

Hybrid circuit techniques that use either bare die and wire bonding or monolithic integration techniques have been proposed as a way to achieve circuit structures having reduced profiles and surface area. The hybrid circuit techniques and monolithic integration techniques can be effective in producing circuit structures having reduced size and acceptable performance. However, additional process and handling complexity and additional testing requirements can make the use of both hybrid circuit techniques and monolithic integration techniques very expensive. This expense generally is offset only at very high unit production volumes, making the hybrid circuit techniques unattractive for many applications.

Miniaturization and increased packaging density trends in computing and instrumentation systems demonstrate a need for electronic circuit structures having reduced size. In view of the relatively large size of electronic circuit structures assembled according to conventional mounting techniques, and the expense of electronic circuit structures assembled according to hybrid circuit techniques and monolithic integration techniques, there continues to be a need for a reduced-size electronic circuit structure that can be assembled in a cost effective manner.

SUMMARY OF THE INVENTION

The present invention is directed to an electronic circuit structure having a reduced size. The electronic circuit structure of the present invention is particularly useful in reducing the size of a communication link, such as an optical data communication link, but may be readily applied to other electronic devices in which size reduction is desirable. As will be described, the electronic circuit structure of the present invention takes advantage of a unique component mounting technique whereby an electronic component is suspended within an aperture formed in a circuit substrate. This mounting technique, in accordance with the present invention, reduces the profile of the overall electronic circuit structure. The aperture further enables electronic components to be mounted in a partially overlapping fashion to reduce the lateral surface area of the electronic circuit structure. The electronic circuit structure can make use of standard FR-4, G-10, or ceramic circuit substrates or multilayer flex circuits, as well as electronic components in the form of standard leaded integrated circuit packages, thereby enabling cost-effective assembly. The mounting of the electronic component within the aperture of the circuit substrate, in accordance with the present invention, may provide a further advantage of assisting in heat dissipation. The incorporation of voltage and ground planes having matrix patterns, in accordance with the present invention, can further aid in heat dissipation and provide electrical isolation, capacitive filtering, and impedance control. In addition, the electronic circuit structure of the present invention facilitates high density packaging of several electronic structures, for example, in a stacked or radial configuration.

The advantages of the present invention will be set forth in part in the description that follows, and in part will be apparent from the description, or may be learned by practice of the present invention. The advantages of the present invention will be realized and attained by means particularly pointed out in the written description and claims hereof, as well as in the appended drawings.

As broadly embodied and described herein, the present invention provides, in a first embodiment, an electronic circuit structure comprising a circuit substrate having a first major surface, a second major surface, and a plurality of side surfaces, the circuit substrate including a plurality of conductive surfaces, an aperture extending through the circuit substrate from the first major surface to the second major surface, and an electronic component suspended within the aperture, the electronic component including a plurality of conductive leads coupled to one or more of the conductive surfaces.

In a second embodiment, the present invention provides an optoelectronic connector package comprising a housing, a circuit substrate, mounted within the housing, the circuit substrate having a first major surface, a second major surface, and a plurality of side surfaces, a plurality of conductive surfaces formed on at least one of the first major surface and the second major surface of the circuit substrate, an aperture extending through the circuit substrate from the first major surface to the second major surface, an electronic component suspended within the aperture, the electronic component including a plurality of conductive leads coupled to one or more of the conductive surfaces, a connector structure, mounted within the housing, for receiving an optical fiber, and an optoelectronic component, mounted within the housing and coupled to both the connector structure and the electronic component, for receiving an optical signal from the optical fiber, and for converting the optical signal to an electrical signal, the electronic component receiving the electrical signal from the optoelectronic component.

In a third embodiment, the present invention provides an electronic circuit structure comprising a first dielectric layer, a ground plane formed adjacent the first dielectric layer, a voltage plane formed adjacent the first dielectric layer opposite the ground plane, a second dielectric layer formed adjacent the ground plane opposite the first dielectric layer, a third dielectric layer formed adjacent the voltage plane opposite the first dielectric layer, a first signal layer formed adjacent the second dielectric layer opposite the ground plane, and a second signal layer formed adjacent the third dielectric layer opposite the voltage plane, at least one aperture extending through the first dielectric layer, the ground plane, the voltage plane, the second dielectric layer, the third dielectric layer, the first signal layer, and the second signal layer, and an electronic component suspended within the aperture, wherein each of the voltage plane and the ground plane includes an array of additional apertures.

It is to be understood that both the foregoing general description and the following detailed description are exemplary and explanatory only, and not restrictive of the present invention, as claimed.

BRIEF DESCRIPTION OF THE DRAWINGS

The accompanying drawings are included to provide a further understanding of the present invention and are incorporated in and constitute a part of this specification. The drawings illustrate exemplary embodiments of the present invention and together with the description serve to explain the principles of the invention.

FIG. 2B is a cross-sectional side view of a second exemplary electronic circuit structure, in accordance with the first embodiment of the present invention;

FIG. 2C is a cross-sectional side view of a third exemplary electronic circuit structure, in accordance with the first embodiment of the present invention;

FIG. 4 is a side view of a first exemplary optoelectronic connector package incorporating an electronic circuit structure, in accordance with a second embodiment the present invention;

FIG. 6 is a side view of the second exemplary optoelectronic connector package shown in FIG. 5;

DETAILED DESCRIPTION OF THE PREFERRED EMBODIMENTS

Figure 1:
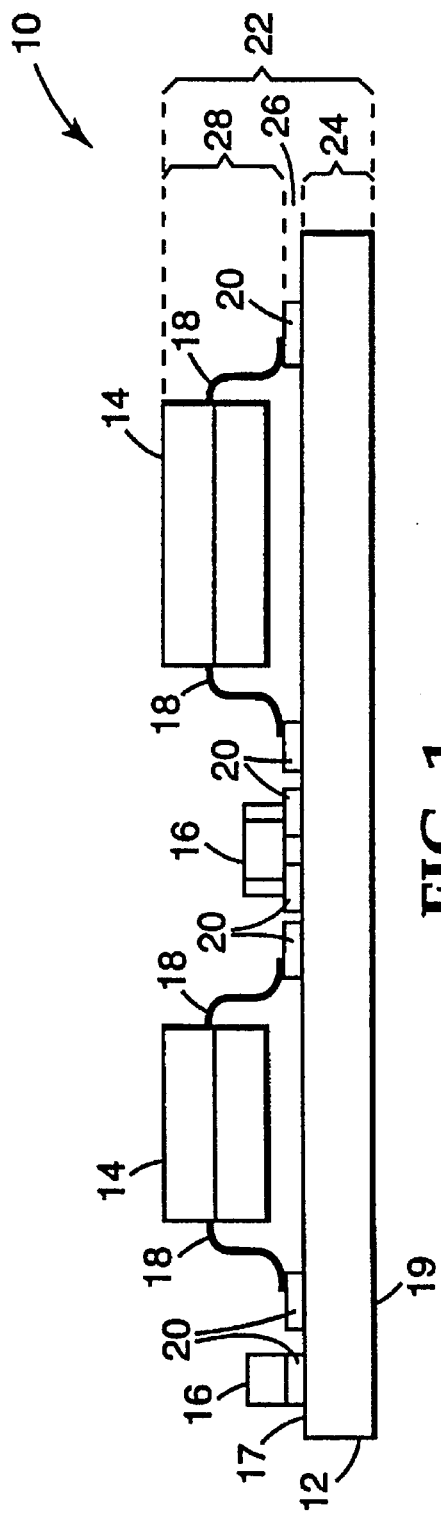
FIG. 1 is a side view of an electronic circuit structure assembled according to conventional surface mount techniques.

FIG. 1 is a side view of an electronic circuit structure 10 assembled according to conventional surface mounting techniques. The electronic circuit structure 10, as shown in FIG. 1, includes a circuit substrate 12, one or more integrated electronic components 14, and a plurality of discrete electronic components 16. The integrated electronic components 14 typically include active electronic circuitry, whereas discrete electronic components 16 include passive electronic components. In the context of an optical fiber communication link, integrated electronic components 14 may comprise, for example, drivers, transimpedance amplifiers, and decision circuits, and discrete integrated electronic components 16 may comprise a variety of resistors, capacitors, or inductors.

The circuit structure 12 has a first major surface 17 and a second major surface 19, as well as a plurality of side surfaces. A plurality of conductive traces (not shown) are formed on one or both of the first and second major surfaces 17, 19 of circuit substrate 12. In addition, a plurality of conductive contact pads 20 are formed on at least first major surface 17 and coupled to the conductive traces. The integrated electronic components 14 include conductive leads 18 that extend from a package associated with the integrated electronic component. The leads 18 are bonded to contact pads 20 by, for example, solder to effect a surface mount of integrated circuit components 14. The discrete electronic components 16 include conductive surfaces that are directly bonded onto contact pads 20, also by solder, to achieve a surface mount.

The electronic circuit structure 10 of FIG. 1 has an undesirably large size due to the nature of the surface mounting technique. In particular, the conventional surface mounting technique produces a large profile 22, measured as the overall thickness of electronic circuit structure 10, extending in a direction substantially perpendicular to first major surface 17 and second major surface 19. The profile 22 is approximately equal to the sum of the thickness 24 of circuit substrate 12, the thickness 26 of contact pads 20, and the thickness 28 of the largest integrated circuit component 14 surface mounted on first major surface 17. Although the thickness 26 of contact pads 20 is somewhat exaggerated in FIG. 1 for purposes of illustration, this dimension ordinarily is not trivial in determining the profile of electronic circuit structure 10. In the example of FIG. 1, integrated electronic components 14 and discrete electronic components 16 are shown as being surface mounted on only first major surface 17 of circuit substrate 12. In many cases, however, electronic components 14, 16 may be surface mounted on both first major surface 17 and second major surface 19. Consequently, the profile of electronic circuit structure 10 can be even larger than shown in FIG. 1.

The conventional surface mounting technique also requires an undesirably large surface area for circuit substrate 12. Specifically, the conventional surface mounting technique requires sufficient lateral clearance between adjacent electronic components 14, 16 in order to avoid shorting due to solder bridging, shorting due to misregistration of components, and electrical crosstalk between the components. The necessary lateral clearance consumes a considerable amount of substrate real estate between electronic components 14, 16. The conductive leads 18 of integrated electronic components 14 also may be bonded to different contact pads 20 than the contact pads over which discrete electronic component 16 is surface mounted. As a result, the overall electronic circuit structure 10 has an undesirably large surface area, making it unsuitable for some applications in which reduced surface area is a concern.

Figure 2A:
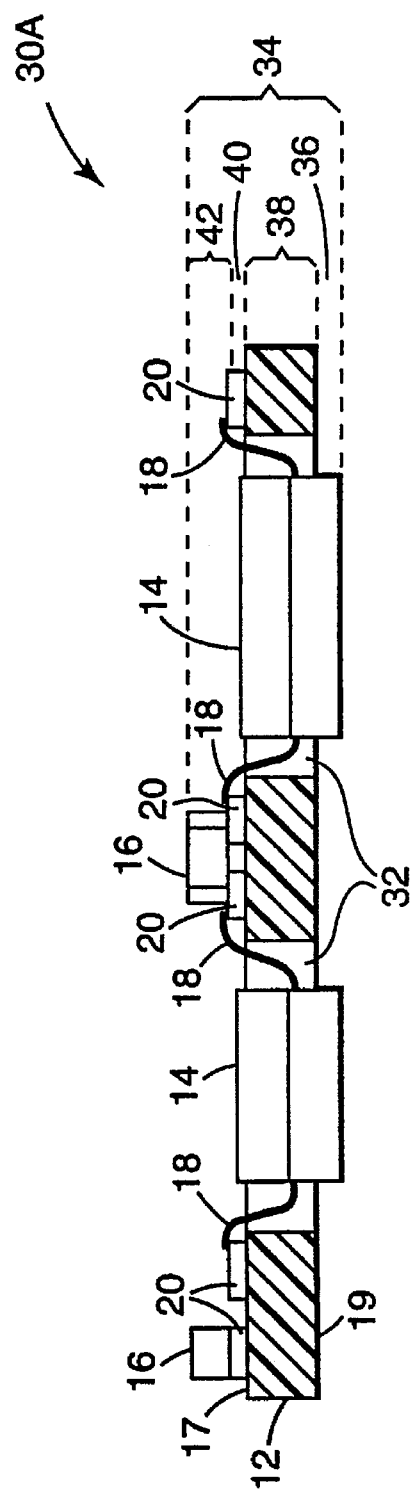
FIG. 2A is a cross-sectional side view of a first exemplary electronic circuit structure, in accordance with a first embodiment of the present invention.

FIG. 2A is a cross-sectional side view of a first exemplary electronic circuit structure 30A, in accordance with a first embodiment of the present invention. Like electronic circuit structure 10 of FIG. 1, structure 30A of FIG. 2A includes a circuit substrate 12, one or more integrated electronic components 14, a plurality of discrete electronic components 16, and a plurality of contact pads 20 formed on the circuit substrate. The contact pads 20 are coupled to conductive traces formed on first major surface 17 and/or second major surface 19 of circuit substrate 12. In addition, discrete electronic components 16 are surface mounted to contact pads 20 on first major surface 17 and/or second major surface 19 of circuit substrate 12.

Unlike electronic circuit structure 10 of FIG. 1, however, electronic circuit structure 30A of FIG. 2A further includes one or more apertures 32 extending through circuit substrate 12 from first major surface 17 to second major surface 19. Integrated electronic components 14 are suspended within apertures 32. In the example of FIG. 2A, integrated electronic components 14 are suspended within apertures 32 in an inverted fashion such that only a portion of the integrated electronic component extends below second major surface 19, and another portion is substantially flush with first major surface 17. The integrated electronic component 14 suspended within aperture 32 may comprise a standard leaded integrated circuit package. The package includes a plurality of conductive leads 18 coupled to one or more of conductive contact pads 20 on first major surface 17. The conductive leads 18 are bonded to contact pads 20 and may serve, at least in part, to suspend integrated electronic component 14 within aperture 32. It may be particularly advantageous, in accordance with the present invention, to suspend integrated electronic component 14 within aperture 32 entirely by its own conductive leads 18 to thereby eliminate the need for any external support means that otherwise could add to the profile of circuit structure 30A.

The aperture 32 can be formed, for example, by milling, punching, or drilling circuit substrate 12. After formation, the interior sides of aperture 32 can be plated with a conductive material to reduce the amount of electromagnetic interference propagated throughout electronic circuit structure 30A. The circuit substrate 12 may comprise, for example, a standard FR-4, G-10, or ceramic substrate, or alternatively a multilayer flex circuit substrate. The thickness of circuit substrate 12 may vary according to the application. For minimal profile, however, circuit substrate 12 should have a thickness of less than approximately two millimeters, and preferably less than one millimeter.

The suspension of integrated electronic component 14 within aperture 32, in accordance with the present invention, produces a significantly reduced profile 34 for the overall electronic circuit structure 30A. As with electronic circuit structure 10 of FIG. 1, profile 34 is measured as the overall thickness of electronic circuit structure 30A, extending in a direction substantially perpendicular to first major surface 17 and second major surface 19. As shown in FIG. 2A, profile 34 of electronic circuit structure 30A is less than profile 22 of electronic circuit structure 10. In particular, profile 34 clearly is less than a sum of a thickness of electronic component 14 and a thickness of circuit substrate 12. Rather, in the example of FIG. 2A, profile 34 is approximately equal to a sum of a thickness 36 of any portion of integrated electronic component 14 extending outside of aperture 32 below second major surface 19, a thickness 38 of circuit substrate 12, a thickness 40 of contact pads 20 over which the discrete electronic components 16 are mounted, and a thickness 42 of the discrete electronic component having the largest thickness.

If integrated electronic component 14 has a smaller thickness than shown in FIG. 2A, it is possible that no portion will extend outside of aperture 32. In other words, it is conceivable that the entire thickness of integrated electronic component 14 may reside within aperture 32. In such a case, profile 34 of the overall electronic circuit structure 30A will be further reduced to be approximately equivalent to a sum of thickness 42 of discrete electronic component 16, thickness 40 of contact pads 20, and thickness 38 of circuit substrate 12.

The electronic circuit structure 30A of FIG. 2A also enhances thermal dissipation. Specifically, integrated electronic components 14 are suspended within apertures 32 such that both sides of the electronic components are accessible and open to ambient temperatures. In a conventional electronic circuit structure 10, shown in FIG. 1, one side of an integrated electronic component 14 is surface mounted in close proximity to first major surface 17 of circuit substrate 12, making thermal dissipation more difficult. In contrast, the suspension of integrated electronic components 14 within apertures 32, in accordance with the present invention, provides an additional thermal path around the component and between first major surface 17 and second major surface 19 of circuit substrate 12.

FIG. 2B is a cross-sectional side view of a second exemplary electronic circuit structure 30B, in accordance with the first embodiment of the present invention. The electronic circuit structure 30B of FIG. 2B substantially corresponds to electronic circuit structure 30A of FIG. 2A, but includes a plurality of contact pads 20 formed on second major surface 19 of circuit substrate 12. As in electronic circuit structure 30A, integrated circuit components 14 are suspended within apertures 32, preferably by conductive leads 18. In contrast, however, conductive leads 18 of one of integrated electronic components 14 are coupled to contact pads 20 formed on first major surface 17, whereas the conductive leads of the other integrated electronic component are coupled to contact pads formed on second major surface 19.

The electronic circuit structure 30B produces a profile 44 that, like profile 34 of electronic circuit structure 30A, is less than profile 22 of electronic circuit structure 10, and thus less than the sum of the thickness of electronic component 14 and the thickness of circuit substrate 12; In particular, profile 44 is approximately equal to a sum of a thickness 46 of any portion of the integrated electronic components 14 extending outside of aperture 32 below second major surface 19, a thickness 48 of circuit substrate 12, a thickness 50 of contact pads 20 over which the discrete electronic components 16 are mounted, and a thickness 51 of the discrete electronic component having the largest thickness. Again, if integrated electronic components 14 have a smaller thickness than shown in FIG. 2B, it is conceivable that the entire thickness of the integrated electronic components may reside within aperture 32. As a result, profile 44 of the overall electronic circuit structure 30B may be further reduced.

The electronic circuit structure 30B also provides a significant reduction in the surface area of circuit substrate 12. As shown in FIG. 2B, portions of at least some of contact pads 20 on first major surface 17 coupled to conductive leads 18 of one of the integrated electronic components 14 are in substantially overlapping alignment with portions of at least some of contact pads 20 on second major surface 19 coupled to conductive leads of the other of the integrated electronic components. In addition, as shown in FIG. 2B, portions of at least some of contact pads 20 on first major surface 17 over which discrete electronic components 16 are surface mounted are in substantially overlapping alignment with portions of at least some of contact pads 20 on second major surface 19 coupled to leads 18 of integrated electronic components 14. The overlapping arrangement of contact pads 20 on opposite surfaces 17, 19, in accordance with the present invention, eliminates the lateral clearances that otherwise would be necessary with conventional surface mounting techniques. Elimination of the lateral clearances enables electronic circuit structure 30B to be used for applications in which available surface area is minimal. In addition, elimination of the lateral clearances can minimize path length between coupled components, particularly if direct vias are provided between overlapping contact pads 20.

FIG. 2C is a cross-sectional side view of a third exemplary electronic circuit structure 30C, in accordance with the first embodiment of the present invention. The electronic circuit structure 30C of FIG. 2B substantially corresponds to electronic circuit structures 30A and 30B of FIGS. 2A and 2B, respectively. The leads 18 of each of integrated electronic components 14 in electronic circuit structure 30C are coupled to contact pads 20 formed on second major surface 19 of circuit substrate 12, however, such that each of the integrated electronic components is suspended within apertures 32 with an orientation inverse to that of electronic circuit structure 30A. The electronic circuit structure 30C produces a profile 52 that, like profiles 34 and 44 of electronic circuit structures 30A and 30B, respectively, is less than profile 22 of electronic circuit structure 10, and thus less than the sum of the thickness of electronic component 14 and the thickness of circuit substrate 12. The profile 52 is approximately equal to a sum of a thickness 54 of contact pads 20 on second major surface 19, a thickness 56 of circuit substrate 12, a thickness 57 of contact pads 20 on first major surface 17, and a thickness 58 of the largest discrete electronic component 16 surface mounted over the contact pads on the first major surface. Because neither of integrated electronic components 14 extends outside of apertures 32 adjacent second major surface 19 of circuit substrate 12, profile 52 may be less than profiles 34, 44 of electronic circuit structures 30A, 30B, respectively.

Like electronic circuit structure 30B of FIG. 2B, electronic circuit structure 30C of FIG. 2C also provides a significant reduction in the surface area of circuit substrate 12. As shown in FIG. 2C, portions of at least some of contact pads 20 on second major surface 17 coupled to conductive leads 18 of one of the integrated electronic components 14 are in substantially overlapping alignment with portions of at least some of contact pads 20 on first major surface 17 over which discrete electronic components 16 are surface mounted. The overlapping arrangement of contact pads 20 on opposite surfaces 17, 19, in accordance with the present invention, eliminates the lateral clearances between integrated electronic components 14 and discrete electronic components 16 that otherwise would be necessary with conventional surface mounting techniques. As with electronic circuit structure 30B, elimination of the lateral clearances enables electronic circuit structure 30C of FIG. 2C to be used for applications in which available surface area is minimal.

Figure 3:
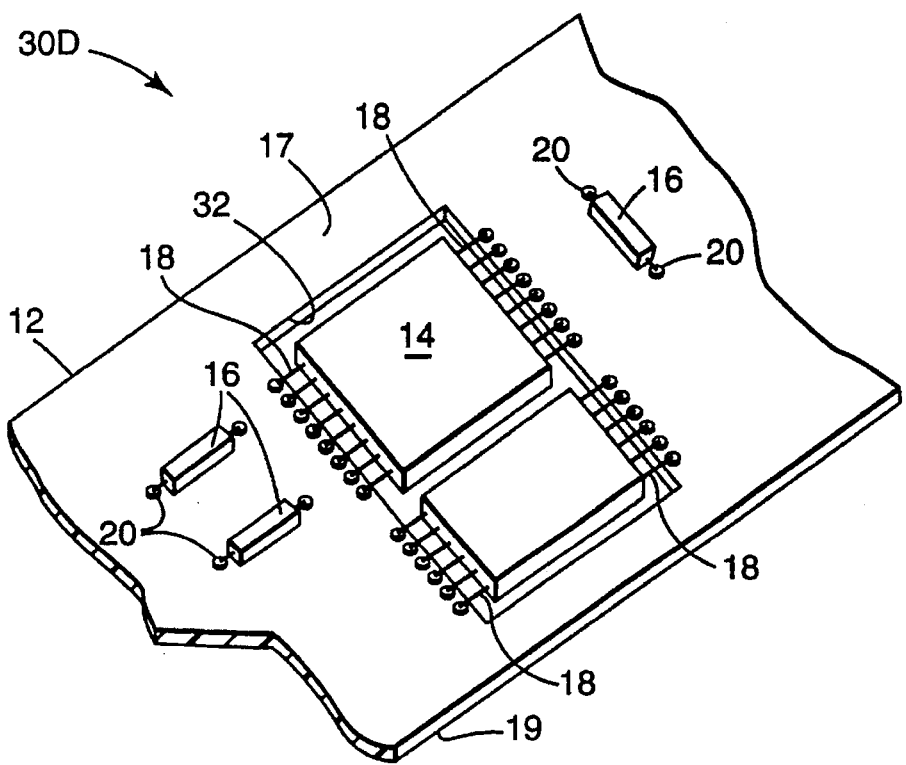
FIG. 3 is a top perspective view of an electronic circuit structure, in accordance with the first embodiment of the present invention.

FIG. 3 is a top perspective view of another exemplary electronic circuit structure 30D, in accordance with the first embodiment of the present invention. The electronic circuit structure 30D substantially corresponds to electronic circuit structures 30A–30C of FIGS. 2A–2C, but further includes two or more integrated electronic components 14 suspended within the same aperture 32. As shown in FIG. 3, integrated electronic components 14 can be placed side-by-side within aperture 32 to reduce an overall length of circuit substrate 12, provided that the application of electronic circuit structure 30D can accommodate additional width, if necessary. The integrated electronic components 14 suspended within apertures 32 can share the same mounting orientation or can be mounted opposite to one another. In other words, conductive leads 18 of each of integrated electronic components 14 can be coupled to contact pads 20 on either first major surface 17 or second major surface 19. The resulting profile of electronic circuit structure 30D clearly will be less than profile 22 of the conventional electronic circuit structure 10 of FIG. 1, and will be comparable to profiles 34, 44, 52 of electronic circuit structures 30A–30C of FIGS. 2A–2C.

FIG. 4 is a side view of a first exemplary optoelectronic connector package 60 incorporating an electronic circuit structure 30E, in accordance with a second embodiment of the present invention. The optoelectronic connector package 60 may be used, for example, in distributed computing or instrumentation systems in which reduced size and/or increased packaging density is desired. The electronic circuit structure 30E may substantially correspond to any of electronic circuit structures 30A–30D shown in FIGS. 2A–2C and FIG. 3. The electronic circuit structure 30E includes, for example, a circuit substrate 12, integrated electronic components 14 suspended within apertures 32 formed in the circuit substrate, and discrete electronic components 16 surface mounted to contact pads formed on the circuit substrate.

In addition to electronic circuit structure 30E, optoelectronic connector package 60 includes a housing 64 and an optoelectronic component 66 mounted within the housing. The optoelectronic component 66 may include a ferrule assembly 68 designed to receive an optical fiber 70. The optoelectronic component 66 can be coupled to optical fiber 70 by, for example, optical fiber connector hardware such as that disclosed in U.S. Pat. No. 5,325,455. The optoelectronic component 66 converts optical signals received from optical fiber 70 into electrical signals for application to circuitry carded by electronic circuit structure 30E. The electronic circuit structure 30E can be mounted within housing 64 by attachment to the interior of a bottom wall 72 via a sheet of thermal transfer tape 74. Once mounted within housing 64, circuitry carded by electronic circuit structure 30E is coupled to optoelectronic component 66 to receive or transmit electrical signals. The circuitry carded by electronic circuit structure 30E can be coupled to a connector (not shown) on optoelectronic, connector package 60 to receive or transmit the electrical signals to or from external processor or interface circuitry.

Figure 5:
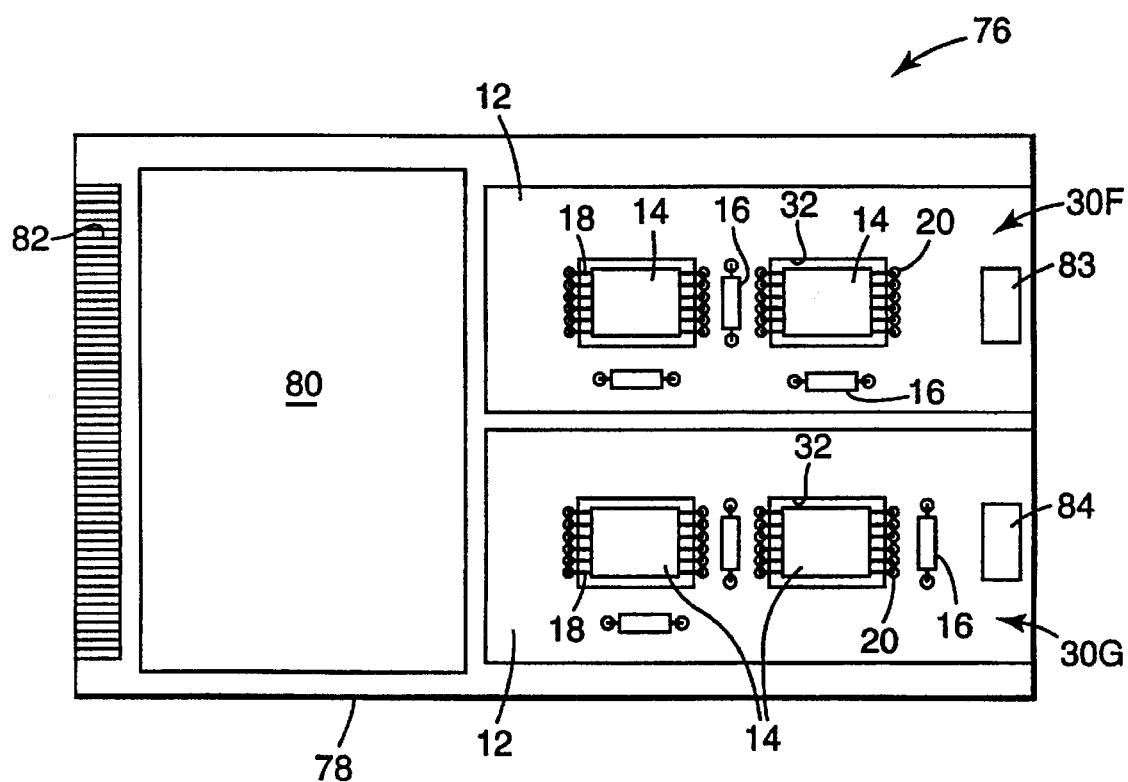
FIG. 5 is a top plan view of a second exemplary optoelectronic connector package incorporating an electronic circuit structures, in accordance with the second embodiment of the present invention.

FIG. 5 is a top plan view of a second exemplary optoelectronic connector package 76 incorporating electronic circuit structures 30F and 30G, in accordance with the second embodiment of the present invention. The optoelectronic connector package 76 may be used, for example, in distributed computing or instrumentation systems in which reduced size and/or increased packaging density is desired. The optoelectronic connector package 76 may be even more useful, however, for application in personal computers in which size reduction is critical. In particular, optoelectronic electronic package 76 can be readily constructed to conform to PCMCIA form factors. As shown in FIG. 5, optoelectronic connector package 76 includes a housing 78, an area 80 for interface and/or processor circuitry, and a connector 82 for coupling the interface and/or processor circuitry to external circuitry, such as circuitry associated with a PCMCIA port within a personal computing system.

Mounted adjacent area 80 are a first electronic circuit structure 30F and a second electronic circuit structure 30G. The electronic circuit structures 30F, 30G may substantially correspond to any of electronic circuit structures 30A–30D shown in FIGS. 2A–2C and FIG. 3. Each of electronic circuit structures 30F, 30G includes, for example, a circuit substrate 12, integrated electronic components 14 suspended within apertures 32 formed in the circuit substrate, and discrete electronic components 16 surface mounted to contact pads formed on the circuit substrate. The first electronic circuit structure 30F may function as an optical receiver, whereas second electronic circuit structure 30G may function as an optical transmitter. Thus, first electronic circuit structure 30F includes an optoelectronic component 83 designed to convert optical signals received via an optical fiber into electrical signals. The electrical signals are processed by circuitry carried by first electronic circuit structure 30F and transmitted to additional circuitry mounted within area 80 of optoelectronic connector package 76. The second electronic circuit structure 30G includes an optoelectronic component 84 designed to convert electrical signals received from circuitry on the electronic circuit structure to optical signals for transmission via an optical fiber. The optoelectronic components 83, 84 can be coupled to respective optical fibers by, for example, optical fiber connector hardware such as that disclosed in U.S. Pat. No. 5,325,455.

FIG. 6 is a side view of the second exemplary optoelectronic connector package 76 shown in FIG. 5. As shown in FIG. 6, housing 78 of optoelectronic connector package 76 includes a top metallic surface 85 and a bottom metallic surface 86. The top and bottom metallic surfaces 85, 86 include opposing plastic frames that can be sealed or otherwise coupled together to form a card-like package. FIG. 6 shows electronic circuit structure 30G mounted within optoelectronic connector package 76 along with the interface and/or processing circuitry contained in area 80 and connector 82. The reduced profile of electronic circuit structure 30G enables the entire optoelectronic connector package to be readily assembled according to PCMCIA form factors, for use in small personal computers such as portable computers and personal digital assistants (PDA's).

Figure 7:
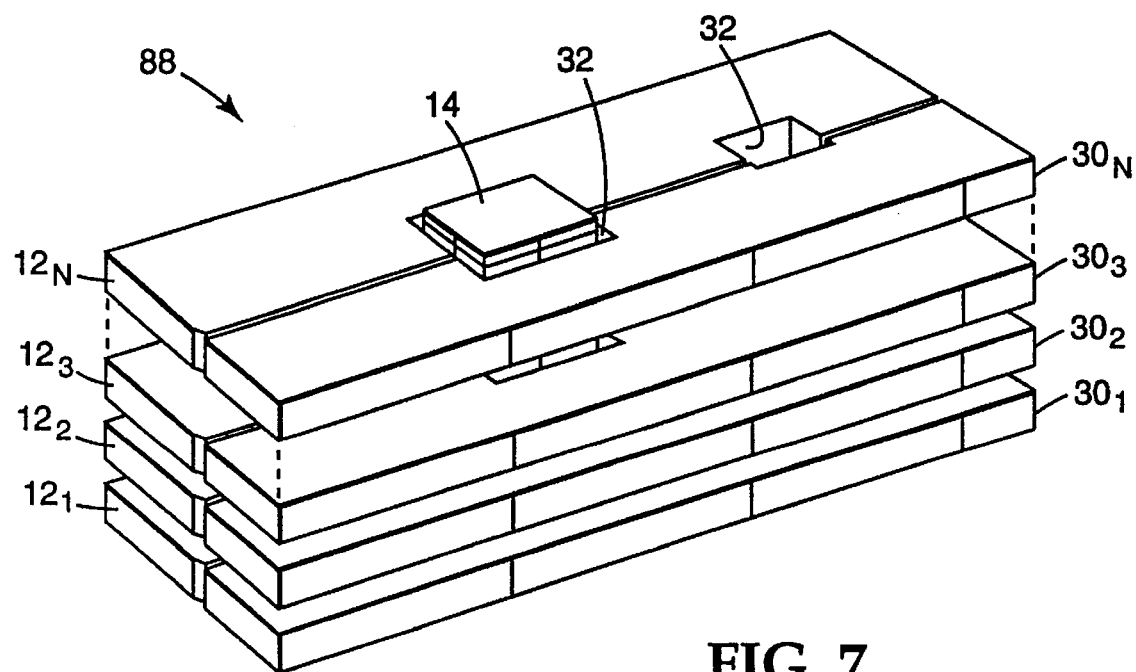
FIG. 7 is a side perspective view of a plurality of electronic circuit structures arranged in a stacked configuration, in accordance with the present invention.

FIG. 7 is a side perspective view of a plurality of electronic circuit structures $30_1$–$30_N$ arranged in a stacked configuration 88, in accordance with the present invention. Each of electronic circuit structures $30_1$–$30_N$ in stacked configuration 88 may substantially conform to any of electronic circuit structures 30A–30D shown in FIGS. 2A–2C and 3, respectively. The stacked configuration 88 enables a large number of electronic circuit structures $30_1$–$30_N$ to be concentrated within a small volume. Thus, stacked configuration 88 may be particularly useful in communication bridges, routers, and non-blocking data switches where space is severely limited. As shown in FIG. 7, electronic circuit structures $30_1$–$30_N$ are stacked adjacent one another to form a block. Several discrete blocks of electronic circuit structures $30_1$–$30_N$, each in the form of stacked configuration 88, can be incorporated in a tight space to achieve a high concentration of data communication links. Proper alignment of apertures 32 of each of electronic circuit structures $30_1$–$30_N$ provides air flow between circuit layers within each circuit substrate $12_1$–$12_N$ that assists in thermal dissipation. The electronic circuit structures $30_1$–$30_N$ in stacked configuration 88 can be closely stacked using thin stand-offs. Alternatively, dielectric thermal transfer tape can be used to hold circuit substrates $12_1$–$12_N$ together, while facilitating uniform thermal distribution.

Figure 8:
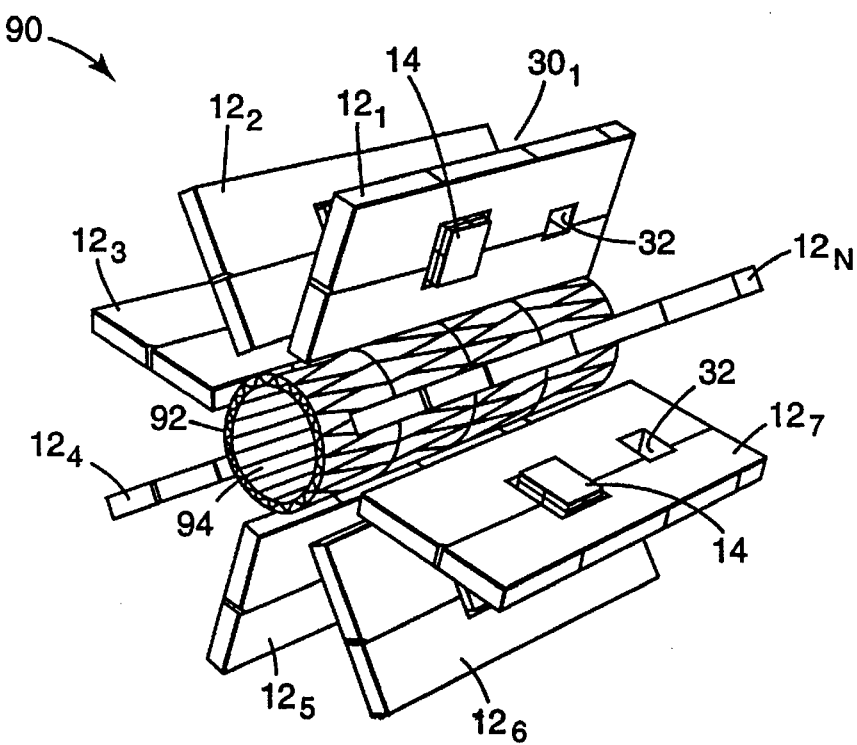
FIG. 8 is a side perspective view of a plurality of electronic circuit structures arranged in a radial configuration, in accordance with the present invention.

FIG. 8 is a side perspective view of a plurality of electronic circuit structures $30_1$–$30_N$ arranged in a radial configuration 90, in accordance with the present intention. Once again, each of electronic circuit structures $30_1$–$30_N$ in radial configuration 90 may substantially conform to any of electronic circuit structures 30A–30D shown in FIGS. 2A–2C and 3, respectively. The radial configuration 90 is not as space efficient as stacked configuration 88 of FIG. 7, but may be advantageous when maximum thermal dissipation and/or electrical isolation is desired. The radial configuration 90 may include a conductive core 92 having an aperture 94. The core 92 can be configured for use as a distribution center to route signals between electronic circuit structures $30_1$–$30_N$. In addition, core 92 may be configured to function as a low inductance power/ground distribution center for routing voltage and ground references to electronic circuit structures $30_1$–$30_N$.

Figure 9:
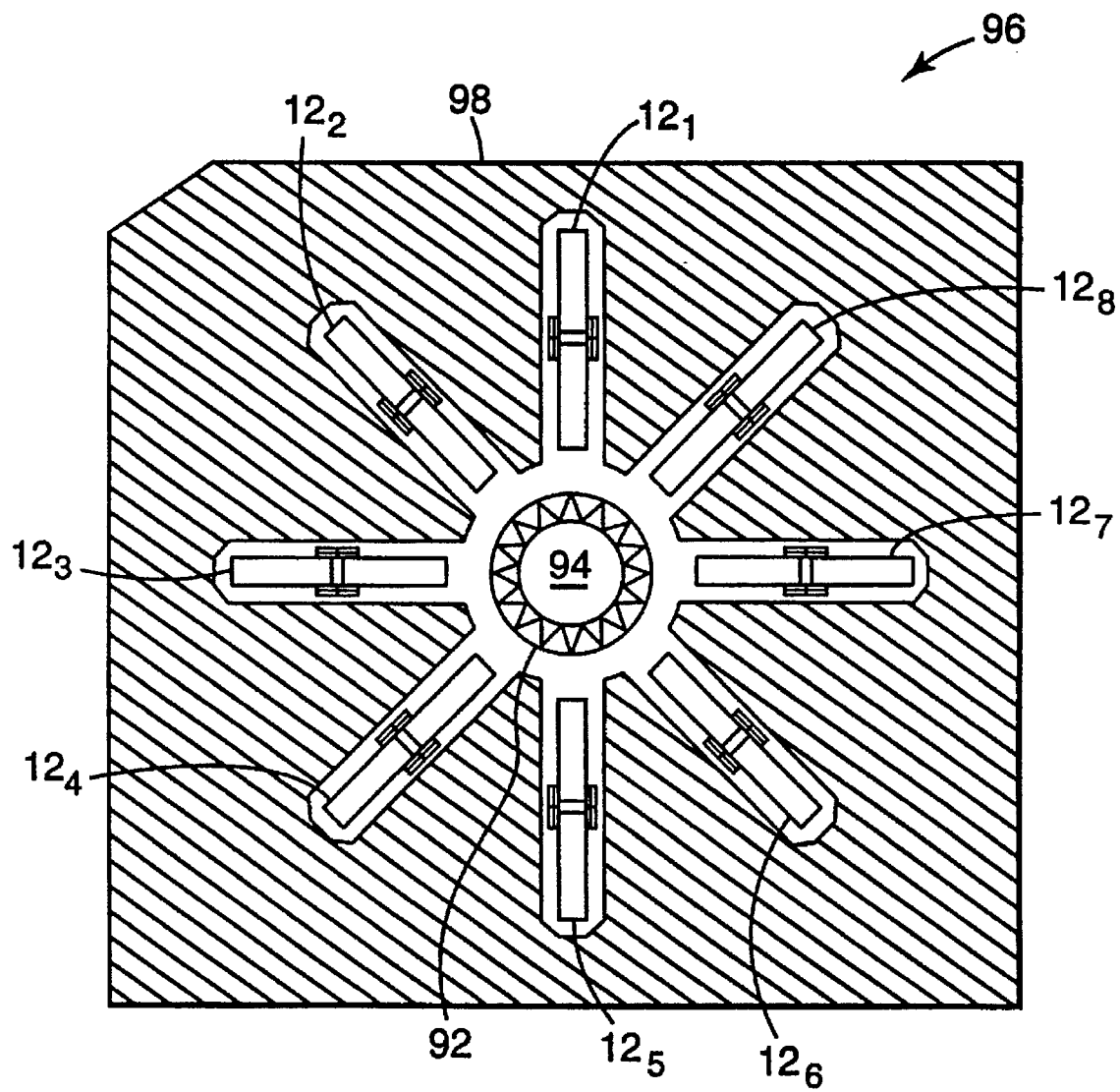
FIG. 9 is a front view of a plurality of electronic circuit structures arranged in a radial configuration and held in a housing, in accordance with the present invention.

FIG. 9 is a front view of a plurality of electronic circuit structures $30_1$–$30_N$ arranged in a radial configuration 96 and held in a housing 98, in accordance with the invention. The radial configuration 96 of FIG. 9 substantially corresponds to that shown in FIG. 8, but allows blocks of electronic circuit structures $30_1$–$30_N$ to be mounted in a rugged housing 98. The housing 98 can be constructed, for example, from aluminum, and can be configured to provide added heat sinking, electrical isolation, and/or impedance control. Multiple housings 98 could be grouped together in a tight volume to provide a large number of communication links.

Figure 10:
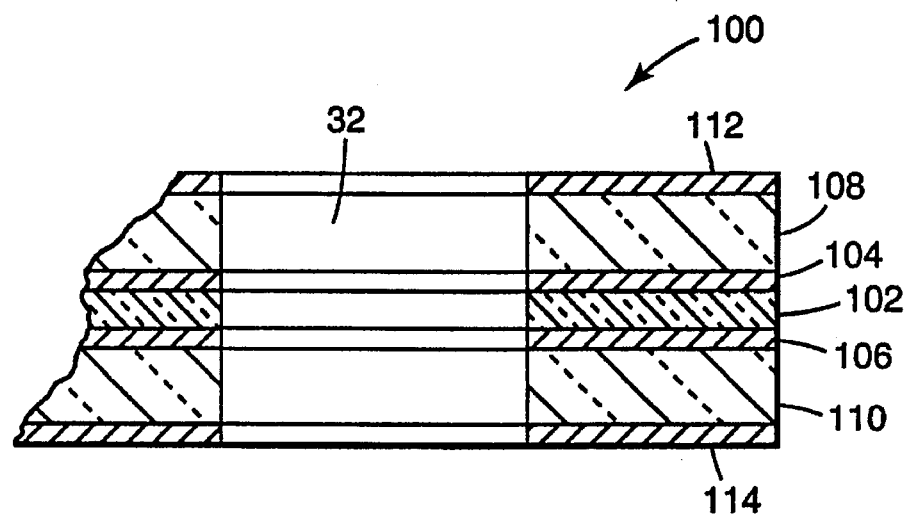
FIG. 10 is a cross-sectional side view of a circuit substrate incorporating voltage and ground planes having an array of apertures, in accordance with a third embodiment of the present invention.

Due to the close proximity of adjacent electronic circuit structures $30_1$–$30_N$ in stacked configuration 88 and radial configurations 90 and 96, electrical isolation, thermal dissipation, and impedance control may be significant concerns. Moreover, such concerns also may exist with respect to individual electronic circuit structures $30_1$–$30_N$ as the size of the individual structure is reduced. FIG. 10 is a cross-sectional side view of a circuit substrate 100 incorporating a voltage plane and a ground plane having matrix patterns defined by an array of apertures, in accordance with a third embodiment of the present invention. The matrix patterns of the voltage plane and ground plane assist in thermal dissipation, enhance electrical isolation, provide intrinsic capacitive filtering of spurious signals, enable impedance control, and accommodate the formation of microstrip signal paths with proper trace dimension and spacing. The circuit substrate 100 may be readily incorporated in electronic circuit structures $30_1$–$30_N$ to alleviate the above-mentioned problems.

As shown in FIG. 10, circuit substrate 100 includes a first dielectric layer 102, a metallic voltage plane 104, a metallic ground plane 106, a second dielectric layer 108, a third dielectric layer 110, a first signal layer 112, and a second signal layer 114. The voltage and ground planes 104, 106 can be made, for example, from copper. If used in conjunction with one of electronic circuit structures 30A–30D of FIGS. 2A–2C and FIG. 3, circuit substrate 100 may further include one or more apertures 32 extending through first dielectric layer 102, voltage plane 104, ground plane 106, second dielectric layer 108, third dielectric layer 110, first signal layer 112, and second signal layer 114 for suspension of an integrated electronic component 14.

Figure 11:
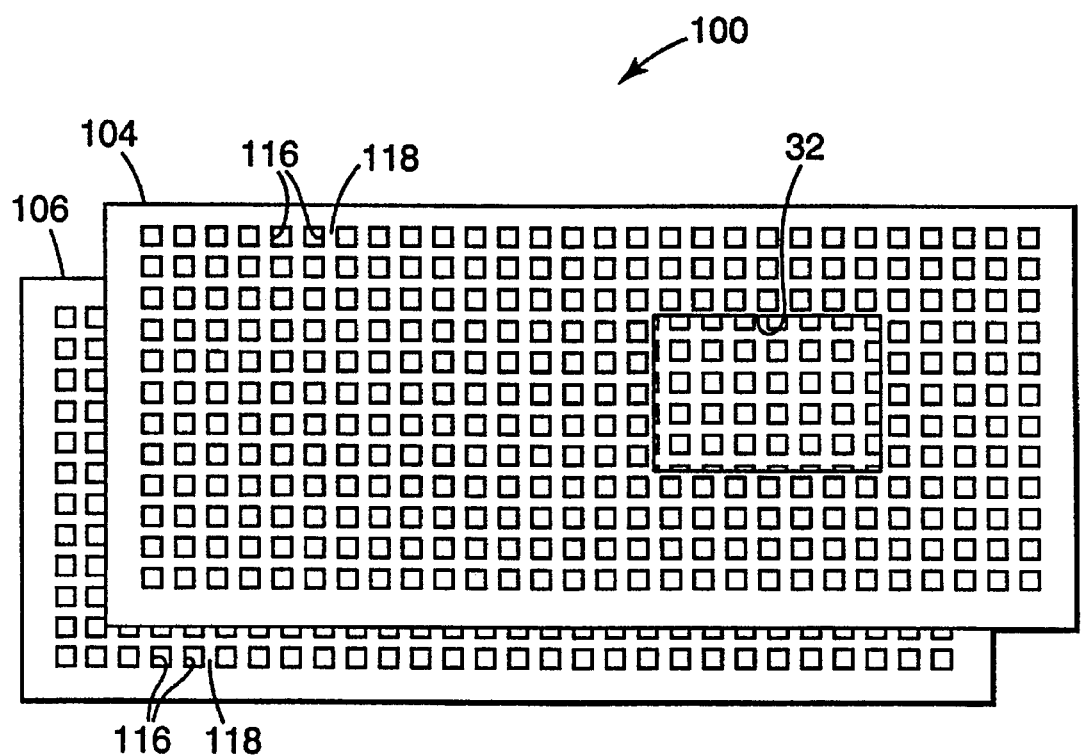
FIG. 11 is a top plan view of voltage and ground planes having an array of apertures, in accordance with the third embodiment of the present invention.

FIG. 11 is a top plan view illustrating an array of apertures defining matrix patterns in voltage plane 104 and ground plane 106 of circuit substrate 100. As shown in FIG. 11, each of voltage plane 104 and ground plane 106 includes an array of matrix apertures 116 separated by solid areas 118 of voltage plane 90 and ground plane 92. The matrix apertures 116 permit thermal transmission through circuit substrate 100, avoiding the trapping or concentration of heat in dielectric layers 102, 108, 110. This feature reduces the susceptibility of voltage plane 104 and ground plane 106 to "hot spots" that can damage the overall electronic circuit structure $30_1$–$30_N$ in which the circuit substrate is incorporated. As a result, the incorporation of higher-powered circuitry within electronic circuit structure $30_1$–$30_N$ is permitted.

In addition, matrix apertures 116 can be precisely sized to have dimensions that are below the cut-off wavelength of the highest frequency signals handled by the circuitry on electronic circuit structure $3_1$–$30_N$. In this manner, the voltage and ground planes 104, 106 effectively act as "electrically solid" conductive planes. The voltage and ground planes 104, 106, with matrix apertures 116 sized below the applicable cut-off wavelength, assist in electrical isolation by substantially preventing propagation of the electromagnetic field generated by the high frequency signals. From shielding theory, the critical maximum dimension $L_{max}$ of each matrix aperture 116 in voltage plane 104 and ground plane 106 can be approximated by the expression:

$$L_{max} <= \lambda/20$$

Thus, the area of each matrix aperture 116 should be less than or equal to approximately $(\lambda/20)^2$. At a frequency of 1000 Mhz, for example, the critical maximum dimension $L_{max}$ of matrix apertures 116 with FR-4 type dielectric material should be approximately 0.6 inches (1.52 centimeters), and the area should be less than or equal to approximately 0.36 square inches (2.31 square centimeters).

The dimension of component-mounting aperture 32 should also be carefully selected to avoid excessive electromagnetic interference. With larger dimensions, aperture 32 may produce an antenna effect that propagates the electromagnetic interference along circuit substrate 12. Therefore, as a general rule, it is preferred that the critical maximum dimension $L_{max}$ of each aperture 32 be less than or equal to approximately $\lambda/8$, and that the area of aperture 32 be less than or equal to approximately $(\lambda/8)^2$. At a frequency of 1000 Mhz, for example, the critical maximum dimension $L_{max}$ of aperture 32 with FR-4 type dielectric material should be less than or equal to approximately 1.5 inches (3.81 centimeters), and the area should be less than or equal to approximately 2.25 square inches (14.52 square centimeters).

The voltage and ground planes 104, 106 can be formed such that matrix apertures 116 of the voltage plane are in either substantial, partial, or non-alignment with apertures 116 of the ground plane. Substantial alignment of matrix apertures 116 produces the best thermal dissipation, but a lesser amount of electrical isolation. In contrast, with non-alignment of matrix apertures 116, solid areas 118 of voltage plane 104 and ground plane are aligned, producing a high degree of electrical isolation, but reducing the rate of thermal dissipation. Thus, different degrees of partial alignment of matrix apertures 116 can be adjusted to achieve a desired balance between thermal and electrical benefits. Periodic solid sections also may be dispersed within voltage plane 104 and ground plane 106 at positions where heat dissipation is not a consideration or local enhancement of electrical isolation is desired. Thus, it will be recognized that the pattern defined by apertures 116 need not form a perfectly rectangular matrix in all cases.

Further, first dielectric layer 102 can be sized to have a relatively small thickness, such that voltage plane 104 and ground plane 106 behave somewhat like a parallel plate capacitor. An approximation of the value of capacitance C developed between voltage plane 104 and ground plane 106 can be expressed by the following equation:

$$C = \epsilon_R S/d$$

where $\epsilon_R$ is the dielectric constant of first dielectric layer 102, S is the surface area of voltage plane 104 and ground plane 106 discounting the aggregate area of apertures 116, and d is the thickness of first dielectric layer 102. Thus, by carefully adjusting the thickness of first dielectric layer 102 and the surface areas of voltage plane 104 and ground 106, an intrinsic capacitance can be provide to filter electrical noise from the power supply paths. As a result, more sensitive circuitry can be used with electronic circuit structure $30_1$–$30_N$ without the need for an excessive number of external filter components, thereby saving cost. Of course, the above adjustments also can be made in order to control the impedance of the conductive paths.

The spatial relationship of voltage plane 104 and ground plane 106 to first signal layer 112 and second signal layer 114, respectively, also can be adjusted to reduce electromagnetic interference. In particular, voltage plane 104 and ground plane 106 should be disposed closer to one another than to either of the adjacent signal layers 112, 114. This arrangement serves to keep more noise between voltage plane 104 and ground plane 106, preventing significant coupling of noise to signal layers 112, 114. The spacing between voltage plane 106 and ground plane 106 preferably is closer than the spacing between either the voltage plane and signal layer 112 or the ground plane and signal layer 114 by greater than or equal to approximately 33 percent. Thus, the thickness of dielectric layer 102 preferably is less than or equal to approximately one-half of the thickness of dielectric layers 108, 110. This spacing ratio has been found to provide an acceptable amount of electrical isolation between voltage plane 106, ground plane 106 and signal layers 112, 114.

The following example is provided to illustrate an electronic circuit structure, in accordance with the present invention, and, in particular, exemplary techniques for fabricating such an electronic circuit structure.

EXAMPLE

An exemplary circuit structure was constructed by bonding a plurality of FR-4 circuit board layers together to form a multilayer laminate circuit substrate 12. Each of the FR-4 circuit board layers had a length of approximately 0.126 inches (0.32 centimeters) and a width of approximately 0.063 inches (0.16 centimeters). The overall multilayer laminate circuit substrate had a thickness of approximately 0.031 inches (0.08 centimeters). A first circuit board layer included a first dielectric layer 102, a copper voltage plane 104 formed on one side of the first dielectric layer, and a copper ground plane 106 formed over a side of the first dielectric layer opposite the voltage plane. The spacing between voltage plane 104 and ground plane 106, and hence the thickness of first dielectric layer 102, was approximately 0.004 inches (0.01 centimeters). The voltage and ground planes 104, 106 were patterned and etched prior to lamination using conventional photolithographic techniques to form a plurality of matrix apertures 116 distributed generally uniformly over the circuit substrate 12 at an approximate density of two-thousand apertures per square inch (per 6.54 square centimeters). This density could be greater or lesser subject to limitations of the printed circuit board fabrication process.

The first circuit board layer was laminated to second and third circuit board layers to form the multilayer laminate circuit substrate. The second and third circuit board layers each included, respectively, a dielectric layer 108, 110 and a signal layer 112, 114. After lamination, the spacing of each of voltage and ground planes 104, 106 to respective signal layers 112, 114 was approximately 0.01 inches (0.025 centimeters). Thus, the thickness of each of dielectric layers 108, 110 was approximately 0.01 inches (0.025 centimeters). The signal layers 112, 114 were patterned and etched using conventional photolithographic techniques to form a plurality of conductive pads 20 and a plurality of conductive traces coupling hardware to be attached to the circuit substrate 12. The dielectric layers 108, 110 were laminated, respectively, to voltage plane 104 and ground plane 106. The first, second, and third dielectric layers 102, 108, 110 were dimensioned such that both the spatial relationship of voltage plane 104 and ground plane 106 to adjacent signal layers 112, 114 and the width of the voltage, ground, and signal layers created an impedance-controlled microstrip line having an impedance of approximately 50 ohms. In particular, the thickness of first dielectric layer 102 was approximately one-half of the thickness of either second or third dielectric layer 108, 110. Consequently, voltage plane 104 and ground plane 106 were closer to one another than to signal layers 112, 114.

The resulting circuit substrate 12 was milled out to form three apertures 32, each having a surface area of approximately 0.25 inches (0.635 centimeters) per side or 0.0625 square inches (0.40 square centimeters). To form an optical communication link circuit structure, an optoelectronic component was surface mounted to circuit substrate 12 via conductive pads 20 and solder. Small Outline Integrated Circuit (SOIC) packaged integrated components 14 were suspended within apertures 32 by coupling electrical leads associated with the packaged components to conductive pads disposed adjacent the apertures. The leads were soldered to the conductive pads without the need for reforming or trimming of the leads. Various discrete, passive components 16, of type 0805 or smaller, were surface-mounted to circuit substrate 12 via conductive pads and solder. The various integrated components 14 and discrete components 16 were coupled to one another via conductive traces formed in the photolithography process to form an optical communication link circuit structure. The complete populated circuit structure resulted in a total circuit structure profile of slightly less than 0.1 inch (0.254 centimeters), and provided characteristics suitable for frequencies on the order of 1 Ghz (2 Gb/s).

Having described the exemplary embodiments of the invention, additional advantages and modifications will readily occur to those skilled in the art from consideration of the specification and practice of the invention disclosed herein. Therefore, the specification and examples should be considered exemplary only, with the true scope and spirit of the invention being indicated by the following claims.

What is claimed is:

1. An electronic circuit structure comprising:

a circuit substrate having a first major surface, a second major surface, and a plurality of side surfaces, said circuit substrate including a plurality of conductive surfaces;

an aperture extending through said circuit substrate from said first major surface to said second major surface; and an electronic component suspended within said aperture, said electronic component including a plurality of conductive leads coupled to one or more of said conductive surfaces, wherein said circuit substrate includes a voltage plane, a ground plane, and a dielectric plane, said voltage plane and said ground plane being disposed on opposite sides of said dielectric plane, wherein said aperture extends through said voltage plane, said ground plane, and said dielectric plane, and wherein each of said voltage plane and said ground plane includes an array of additional apertures.

2. The electronic circuit structure of claim 1, wherein said electronic component is suspended within said aperture at least in part by said plurality of conductive leads.

3. The electronic circuit structure of claim 1, wherein said electronic component is suspended within said aperture only by said plurality of conductive leads.

4. The electronic circuit structure of claim 1, wherein a thickness of said electronic circuit structure, extending in a direction substantially perpendicular to said first major surface and said second major surface, is less than a sum of a thickness of said electronic component and a thickness of said circuit substrate.

5. The electronic circuit structure of claim 1, wherein said electronic component is a first electronic component, said electronic circuit structure further comprising a second electronic component surface mounted to one of said first major surface and said second major surface of said circuit substrate.

6. The electronic circuit structure of claim 5, wherein said plurality of conductive surfaces includes a plurality of contact pads formed on at least one of said first major surface and said second major surface of said circuit substrate, said conductive leads of said first electronic component being coupled to at least some of said contact pads, and said second electronic component being surface mounted over at least some of said contact pads, wherein a thickness of said electronic circuit structure, extending in a direction substantially perpendicular to said first major surface and said second major surface, is approximately equal to a sum of a thickness of said second electronic component, a thickness of said contact pads, a thickness of said circuit substrate, and a thickness of any portion of said first electronic component extending outside of said aperture.

7. The electronic circuit structure of claim 5, wherein said plurality of conductive surfaces includes a plurality of contact pads formed on at least one of said first major surface and said second major surface of said circuit substrate, said conductive leads of said first electronic component being coupled to at least some of said contact pads, and said second electronic component being surface mounted over at least some of said contact pads, wherein a thickness of said electronic circuit structure, extending in a direction substantially perpendicular to said first major surface and said second major surface, is less than a sum of a thickness of said first electronic component, a thickness of said contact pads, and a thickness of said circuit substrate.

8. The electronic circuit structure of claim 5, wherein said plurality of conductive surfaces includes a first plurality of contact pads formed on at least one of said first major surface and said second major surface of said circuit substrate, and a second plurality of contact pads formed on another of said first major surface and said second major surface of said circuit substrate, said conductive leads of said first electronic component being coupled to at least some of said first plurality of contact pads, and said second electronic component being surface mounted over at least some of said second plurality of contact pads, wherein portions of at least some of said first plurality of contact pads coupled to said conductive leads of said first electronic component are in substantial overlapping alignment with portions of at least some of said second plurality of contact pads over which said second electronic component is surface mounted.

9. The electronic circuit structure of claim 1, wherein said aperture is a first aperture and said electronic component is a first electronic component, said electronic circuit structure further comprising a second aperture and a second electronic component, said second electronic component being suspended within said second aperture, and said second electronic component including a second plurality of conductive leads coupled to one or more of said conductive surfaces.

10. The electronic circuit structure of claim 9, wherein said plurality of conductive surfaces includes a first plurality of contact pads formed on at least one of said first major surface and said second major surface of said circuit substrate, and a second plurality of contact pads formed on another of said first major surface and said second major surface of said circuit substrate, said conductive leads of said first electronic component being coupled to at least some of said first plurality of contact pads, and said conductive leads of said second electronic component being coupled to at least some of said second plurality of contact pads, wherein portions of said at least some of said first plurality of contact pads coupled to said leads of said first electronic component are in substantial overlapping alignment with portions of said at least some of said second plurality of contact pads coupled to said leads of said second electronic component.

11. The electronic circuit structure of claim 10, further comprising a third electronic component surface mounted over at least some of said first plurality of contact pads, wherein portions of said at least some of said first plurality of contact pads over which said third electronic component is surface mounted are in substantial overlapping alignment with portions of at least some of said second plurality of contact pads coupled to said leads of said second electronic component.

12. The electronic circuit structure of claim 1, further comprising a second electronic component suspended within said aperture, said second electronic component including a second plurality of conductive leads coupled to one or more of said conductive surfaces.

13. The electronic circuit structure of claim 1, wherein an interior of said aperture is plated with a conductive material to reduce electromagnetic interference.

14. The electronic circuit structure of claim 1, wherein said electronic circuit structure comprises a plurality of electronic circuit structures arranged in a stacked configuration.

15. The electronic circuit structure of claim 1, wherein said electronic circuit structure comprises a plurality of electronic circuit structures arranged in a radial configuration.

16. The electronic circuit structure of claim 1, wherein the additional apertures of said voltage plane are in substantial alignment with the additional apertures of said ground plane.

17. The electronic circuit structure of claim 1, wherein the additional apertures of said voltage plane are in only partial alignment with the additional apertures of said ground plane.

18. The electronic circuit structure of claim 1, wherein the additional apertures of said voltage plane are substantially non-aligned with the additional apertures of said ground plane.

19. The electronic circuit structure of claim 1, wherein said electronic component is configured to process electrical signals having a minimum wavelength of $\lambda$, and said aperture has an area of less than or equal to approximately $(\lambda/8)^2$.

20. The electronic circuit structure of claim 1, wherein said electronic component is configured to process electrical signals having a minimum wavelength of $\lambda$, and each of said additional apertures has an area of less than or equal to approximately $(\lambda/20)^2$.

21. An electronic circuit structure comprising:
a first dielectric layer;
a ground plane formed adjacent said first dielectric layer;
a voltage plane formed adjacent said first dielectric layer opposite said ground plane;
a second dielectric layer formed adjacent said ground plane opposite said first dielectric layer;
a third dielectric layer formed adjacent said voltage plane opposite said first dielectric layer;
a first signal layer formed adjacent said second dielectric layer opposite said ground plane; and
a second signal layer formed adjacent said third dielectric layer opposite said voltage plane,
at least one aperture extending through said first dielectric layer, said ground plane, said voltage plane, said second dielectric layer, said third dielectric layer, said first signal layer, and said second signal layer; and
an electronic component suspended within said aperture,
wherein each of said voltage plane and said ground plane includes an array of additional apertures.

22. The electronic circuit structure of claim 21, wherein the additional apertures of said voltage plane are in substantial alignment with the additional apertures of said ground plane.

23. The electronic circuit structure of claim 21, wherein the additional apertures of said voltage plane are in partial alignment with the additional apertures of said ground plane.

24. The electronic circuit structure of claim 21, wherein the additional apertures of said voltage plane are substantially non-aligned with the additional apertures of said ground plane.

25. The electronic circuit structure of claim 21, wherein said electronic component includes a plurality of conductive leads coupled to one or more of said ground plane, said voltage plane, said first signal layer, and said second signal layer, said electronic component being suspended within said aperture at least in part by said conductive leads.

26. The electronic circuit structure of claim 21, wherein said electronic component is configured to process electrical signals having a minimum wavelength of $\lambda$, and each of said apertures has an area of less than or equal to approximately $(\lambda/20)^2$.

27. The electronic circuit structure of claim 21, wherein said electronic component is configured to process electrical signals having a minimum wavelength of $\lambda$, and said aperture has an area of less than or equal to approximately $(\lambda/8)^2$.

* * * * *